United States Patent
Chen et al.

(10) Patent No.: US 12,087,855 B2
(45) Date of Patent: Sep. 10, 2024

(54) VERTICAL UMOSFET DEVICE WITH HIGH CHANNEL MOBILITY AND PREPARATION METHOD THEREOF

(71) Applicant: SUZHOU INSTITUTE OF NANO-TECH AND NANO-BIONICS (SINANO), CHINESE ACADEMY OF SCIENCES, Suzhou (CN)

(72) Inventors: Fu Chen, Suzhou (CN); Wenxin Tang, Suzhou (CN); Guohao Yu, Suzhou (CN); Baoshun Zhang, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 555 days.

(21) Appl. No.: 16/630,487

(22) PCT Filed: May 8, 2019

(86) PCT No.: PCT/CN2019/085970
§ 371 (c)(1),
(2) Date: Jan. 13, 2020

(87) PCT Pub. No.: WO2020/133870
PCT Pub. Date: Jul. 2, 2020

(65) Prior Publication Data
US 2021/0384345 A1  Dec. 9, 2021

(30) Foreign Application Priority Data
Dec. 28, 2018  (CN) .......................... 201811629332.0

(51) Int. Cl.
*H01L 29/78* (2006.01)
*H01L 21/265* (2006.01)
(Continued)

(52) U.S. Cl.
CPC .... *H01L 29/7813* (2013.01); *H01L 21/26553* (2013.01); *H01L 29/2003* (2013.01); *H01L 29/66734* (2013.01)

(58) Field of Classification Search
CPC ........... H01L 29/7813; H01L 29/66734; H01L 21/26553
See application file for complete search history.

(56) References Cited

U.S. PATENT DOCUMENTS

| | | | | |
|---|---|---|---|---|
| 9,412,819 B2 * | 8/2016 | Arai | ..................... | H01L 29/7813 |
| 2008/0079065 A1 * | 4/2008 | Zhang | ................ | H01L 29/0619 257/330 |

(Continued)

FOREIGN PATENT DOCUMENTS

CN          102386223 A   *  3/2012

*Primary Examiner* — Younes Boulghassoul
*Assistant Examiner* — Quinton A Brasfield
(74) *Attorney, Agent, or Firm* — PROI Intellectual Property US

(57) ABSTRACT

The present application discloses a vertical UMOSFET device with a high channel mobility and a preparation method thereof. The vertical UMOSFET device with a high channel mobility includes an epitaxial structure, and a source, a drain and a gate which match the epitaxial structure, where the epitaxial structure includes a first semiconductor, and a second semiconductor and a third semiconductor which are sequentially disposed on the first semiconductor, a groove structure matching the gate is also disposed in the epitaxial structure, and the groove structure continuously extends into the first semiconductor from a first surface of the epitaxial structure; a fourth semiconductor is also disposed at least between an inner wall of the groove structure and the second semiconductor, and the fourth semiconductor is a high resistivity semiconductor.

12 Claims, 3 Drawing Sheets

(51) Int. Cl.
    *H01L 29/20*         (2006.01)
    *H01L 29/66*         (2006.01)

(56) References Cited

U.S. PATENT DOCUMENTS

| | | | |
|---|---|---|---|
| 2014/0264564 A1* | 9/2014 | Cheng | H01L 21/049 438/270 |
| 2018/0061934 A1* | 3/2018 | Ueno | H01L 29/66734 |
| 2018/0175147 A1* | 6/2018 | Ohse | H01L 29/0878 |
| 2018/0366549 A1* | 12/2018 | Kojima | H01L 29/7813 |
| 2019/0074373 A1* | 3/2019 | Kobayashi | H01L 29/0623 |
| 2019/0123192 A1* | 4/2019 | Kinpara | H01L 29/0623 |
| 2021/0043765 A1* | 2/2021 | Tanaka | H01L 29/66068 |

\* cited by examiner

VERTICAL UMOSFET DEVICE WITH HIGH CHANNEL MOBILITY AND PREPARATION METHOD THEREOF

TECHNICAL FIELD

The present application relates to a transistor, and in particular, to a vertical UMOSFET device with a high channel mobility and a preparation method thereof, belonging to the technical field of micro-nano manufacturing.

BACKGROUND

With the development of semiconductor materials, the performance of conventional Si-based power devices has approached the theoretical limit determined by material characteristics. In review of the development of Si-based power electronic devices, the overall development direction is to increase capacity and operating frequency, reduce on-state voltage drop, reduce driving power, improve dynamic parameters and multifunction, and the current transmission direction gradually shifts from horizontal direction to vertical direction. GaN-based power devices also have similar development trends. Currently, horizontal-structure GaN-based HEMTs based on AlGaN/GaN hetero-junctions are still dominant, but there are also some problems to be solved. For example, obvious current collapse occurs during operation under the conditions of a high drain bias voltage or pulse; the problems of etching damage, implantation damage, high-voltage operation instability, the like are caused by enhancement-mode GaN HEMT devices based on a grooved gate technology and a fluoride ion implantation technology; and the introduction of a field plate structure increases additional capacitance while improving breakdown voltage of devices, thereby affecting frequency characteristics and the like.

In short, the foregoing problems stimulate the research on vertical structure devices. With the progress of technology, high-quality GaN substrates are gradually entering the market. The demand for application of vertical structure power electronic devices based on GaN substrates and a homoepitaxial technology is already in sight. The vertical structure device can increase the breakdown voltage by increasing the thickness of a drift region without sacrificing the device size, thus being beneficial to implementing a high power density chip.

At present, the vertical devices under most research include two structures, namely a Current Aperture Vertical Electron Transistor (CAVET) structure and a grooved gate MOSFET (UMOSFET) structure. Similar to the horizontal structure, the CAVET structure is also faced with the problem of difficulty in achieving enhancement-mode operation, and a threshold voltage thereof is not sufficient to meet the requirements for high-power automotive applications and the like and cannot prevent misoperation caused by noise and other factors. However, the working principle of the UMOSFET is that a positive voltage is applied to a gate so as to realize the connection of the device in an inversion layer channel formed along the side wall of the grooved gate, and the UMOSFET belongs to enhancement-mode devices. This structure avoids a JFET region existing in a conventional VDMOSFET, which is beneficial to obviously reducing the internal resistance, and can further improve the cell density. At present, a process for preparing the GaN-based UMOSFET has been initially proposed and implemented. For example, in an existing UMOSFET, the epitaxial structure includes a GaN substrate, an n$^-$GaN drift region, a p$^+$GaN base region and an n$^+$GaN source region from bottom to top. After a mesa is isolated, an etching trench passes through the n$^+$GaN source region and the p$^+$GaN base region from the upper surface of the structure to enter the n$^-$GaN drift region while etching a groove of a P-type base region. A source electrode is short-circuited with the p$^+$GaN base region and the n$^+$GaN source region simultaneously. After dielectric layers are deposited at the bottom and side surface of the groove, a gate electrode is formed in the groove, and a drain electrode is formed on the back surface of the substrate. In the prior art, a conductive channel of a device is provided by secondary epitaxy of a thin layer of uGaN in a trench structure, so that the influence of damage caused by trench etching on electron mobility in an inversion layer is avoided. The working principle of the device is also changed from inversion of a channel layer to accumulation of the channel layer to provide conductive channels of a source electrode and a drain electrode; and meanwhile, a dielectric layer is also implemented by in-situ epitaxy. However, the channels of GaN-based horizontal devices are all along a plane (0001), which belongs to polar planes. The existence of piezoelectric polarization and spontaneous polarization effects affects the threshold voltage of the devices. Therefore, in order to realize the characteristics of enhancement-mode (normally-off) devices, the conductive channels of the devices tend to be placed on non-polar planes. For the GaN-based UMOSFET, the most direct method for obtaining the non-polar plane is to obtain a trench perpendicular to the plane (0001) by etching, and the side wall of the trench is the non-polar plane. However, dry etching inevitably causes etching damage, and especially in a trench side wall region, wet etching cannot completely repair the damage. Etching increases the defect density, so that the electron mobility in the channel of the p-GaN inversion layer obviously decreases. The channel region has more on-resistance and reduces the saturation current of the device. It is necessary to apply a greater gate voltage to reduce the channel resistance, but it brings about the reliability problem of the device. In addition, the dynamic characteristics of the device further deteriorate as the surface state density increases.

SUMMARY

In view of the defects of the prior art, a main objective of the present application is to provide a vertical UMOSFET device with a high channel mobility and a preparation method thereof.

In order to achieve the foregoing objective of the present application, the technical solution adopted by the present application is as follows:

An embodiment of the present application provides a vertical UMOSFET device with a high channel mobility, which includes an epitaxial structure, and a source, a drain and a gate which match the epitaxial structure, where the epitaxial structure includes a first semiconductor, and a second semiconductor and a third semiconductor which are sequentially disposed on the first semiconductor, a groove structure matching the gate is also disposed in the epitaxial structure, and the groove structure continuously extends into the first semiconductor from a first surface of the epitaxial structure; a fourth semiconductor is also disposed at least between an inner wall of the groove structure and the second semiconductor, and the fourth semiconductor is a high resistivity semiconductor.

In some more specific embodiments, the fourth semiconductor is formed by converting a portion of the second semiconductor adjacent to the inner wall of the groove structure; and the conversion method includes an ion implantation method or a passivation treatment method.

In some more specific embodiments, the inner wall of the groove structure is smooth, and a side wall and a bottom wall form an angle of 90 degrees.

In some more specific embodiments, a passivation layer is also disposed at least between the gate and the inner wall of the groove structure.

Preferably, the passivation layer includes any one or a combination of two or more of $Al_2O_3$, $SiO_2$, $Si_3N_4$, AlN, and $HfO_2$, but is not limited thereto.

In some more specific embodiments, the first semiconductor includes an $N^-$ drift layer.

In some more specific embodiments, the first semiconductor has a thickness of 1-100 μm.

In some more specific embodiments, the third semiconductor includes an $N^+$ source region layer.

In some more specific embodiments, the second semiconductor includes a $P^+$ channel layer.

Preferably, the second semiconductor includes a P-type wide bandgap semiconductor.

Preferably, the P-type wide bandgap semiconductor includes a P-type Ill-nitride.

Preferably, the P-type III-nitride includes any one of p-GaN and p-InGaN, but is not limited thereto.

In some more specific embodiments, the second semiconductor has a thickness of 200 nm to 100 μm.

In some more specific embodiments, the fourth semiconductor surrounds the gate.

Preferably, the fourth semiconductor includes any one of HR-GaN and HR-InGaN, but is not limited thereto.

In some more specific embodiments, the third semiconductor is formed by converting at least a local region of a surface layer of the second semiconductor.

In some more specific embodiments, the source and the gate are disposed on the first surface of the epitaxial structure, the drain is connected to a second surface of the epitaxial structure, and the first surface and the second surface are faced away from each other.

In some more specific embodiments, the epitaxial structure also includes a groove matching the source, and the groove matching the source extends into the second semiconductor from the surface of the epitaxial structure such that the source is simultaneously electrically connected to at least the second semiconductor and the third semiconductor.

In some more specific embodiments, the UMOSFET device includes two or more sources.

Preferably, the two or more sources are distributed on at least two sides of the gate.

In some more specific embodiments, the UMOSFET device also includes a substrate, the epitaxial structure is formed on a surface of one side of the substrate, and the drain is disposed on a surface of the other side of the substrate faced away from the surface of the side of the substrate.

Preferably, the substrate includes GaN, but is not limited thereto.

Preferably, the substrate is a lightly doped GaN substrate with a dislocation density less than $5\times10^6$ $cm^{-3}$ and a surface roughness less than 0.2 nm.

In some more specific embodiments, the substrate and the first semiconductor are integrated.

In some more specific embodiments, the drain forms ohmic contact with the surface of the other side of the substrate.

In some more specific embodiments, when no voltage is applied to the gate or the applied voltage is lower than zero voltage, the UMOSFET device is in an off state; and when the voltage applied to the gate is greater than zero voltage and higher than a threshold voltage, the UMOSFET device is in an on state.

An embodiment of the present application also provides a method for manufacturing a vertical UMOSFET device with a high channel mobility, which includes the steps of manufacturing an epitaxial structure; and manufacturing a source, a drain and a gate which match the epitaxial structure. The epitaxial structure includes a first semiconductor, and a second semiconductor and a third semiconductor which are sequentially disposed on the first semiconductor. A groove structure matching the gate is also disposed in the epitaxial structure, and the groove structure continuously extends into the first semiconductor from a first surface of the epitaxial structure. The manufacturing method also includes the step of manufacturing a fourth semiconductor in the epitaxial structure. The fourth semiconductor is disposed at least between an inner wall of the groove structure and the second semiconductor, and the fourth semiconductor is a high resistivity semiconductor.

Further, the step of manufacturing the groove structure is performed before or after the step of forming the fourth semiconductor.

Further, the manufacturing method specifically includes: processing at least a region of the second semiconductor corresponding to the groove structure and the fourth semiconductor first to convert a composition material of the second semiconductor in the region into a material of the fourth semiconductor, and then processing the groove structure in the epitaxial structure.

Further, the manufacturing method specifically includes: processing the groove structure in the epitaxial structure first, and then processing a region of the second semiconductor corresponding to the fourth semiconductor to convert a composition material of the second semiconductor in the region into a material of the fourth semiconductor.

Further, the manufacturing method specifically includes: converting a composition material of the second semiconductor into a material of the fourth semiconductor by using at least an ion implantation or passivation treatment method.

Preferably, implanted elements used in the ion implantation method include any one of F, N, Ar, H and O, but are not limited thereto.

Preferably, the passivation treatment method includes a plasma surface passivation treatment method.

Preferably, the passivation treatment method is implemented at a temperature of 300-800° C.

Preferably, the passivation treatment method is implemented in $NH_3$ or $H_2$ atmosphere.

In some more specific embodiments, the fourth semiconductor is formed by converting a portion of the second semiconductor adjacent to the inner wall of the groove structure, and the fourth semiconductor surrounds the gate.

In some more specific embodiments, the inner wall of the groove structure is smooth, and a side wall and a bottom wall form an angle of 90 degrees.

In some more specific embodiments, the manufacturing method further includes: covering at least the inner wall of the groove structure with a continuous passivation layer, and then manufacturing a gate.

Preferably, the passivation layer includes any one or a combination of two or more of $Al_2O_3$, $SiO_2$, $Si_3N_4$, AlN, and $HfO_2$, but is not limited thereto.

In some more specific embodiments, the first semiconductor includes an N⁻ drift layer.

In some more specific embodiments, the first semiconductor has a thickness of 1-100 μm.

In some more specific embodiments, the third semiconductor includes an N⁺ source region layer.

In some more specific embodiments, the second semiconductor includes a P⁺ channel layer.

Preferably, the second semiconductor includes a P-type wide bandgap semiconductor.

Preferably, the P-type wide bandgap semiconductor includes a P-type III-nitride.

Preferably, the P-type III-nitride includes any one of p-GaN and p-InGaN, but is not limited thereto.

In some more specific embodiments, the second semiconductor has a thickness of 200 nm to 100 μm.

In some more specific embodiments, the fourth semiconductor includes any one of HR-GaN and HR-InGaN, but is not limited thereto.

In some more specific embodiments, the third semiconductor is formed by converting at least a local region of a surface layer of the second semiconductor.

In some more specific embodiments, the source and the gate are disposed on the first surface of the epitaxial structure, the drain is connected to a second surface of the epitaxial structure, and the first surface and the second surface are faced away from each other.

Further, the epitaxial structure also includes a groove matching the source, and the groove matching the source extends into the second semiconductor from the surface of the epitaxial structure such that the source is simultaneously electrically connected to at least the second semiconductor and the third semiconductor.

In some more specific embodiments, the UMOSFET device includes two or more sources.

Preferably, the two or more sources are distributed on at least two sides of the gate.

In some more specific embodiments, the UMOSFET device also includes a substrate, the epitaxial structure is formed on a surface of one side of the substrate, and the drain is disposed on a surface of the other side of the substrate faced away from the surface of the side of the substrate.

Preferably, the substrate includes GaN.

Preferably, the substrate is a lightly doped GaN substrate with a dislocation density less than 5×10⁶ cm⁻³ and a surface roughness less than 0.2 nm.

In some more specific embodiments, the substrate and the first semiconductor are integrated.

Further, the drain forms ohmic contact with the surface of the other side of the substrate.

Compared with the prior art, in the method for manufacturing a vertical UMOSFET device with a high channel mobility provided by an embodiment of the present application, a P⁺ channel layer close to the surface of a gate groove is converted into a high resistivity semiconductor, so that a region of the device where inversion actually occurs is transferred from the surface to the inside of the channel layer without etching damage, thereby avoiding deterioration of the mobility of an inversion layer of a channel region caused by trench etching, and obtaining a vertical UMOSFET device with a high channel mobility. Since the P⁺ channel layer and the high resistivity semiconductor can be converted to each other by ion implantation or passivation treatment and the like, this method does not involve secondary epitaxy, has simple process, and avoids interface pollution and parasitic channel problems. Moreover, the process requirements are relatively low, a process window is relatively large, and the damage to the device is small. The UMOSFET devices of multiple solutions can be implemented. The device has high repeatability and low cost, and mass production is easy.

DESCRIPTION OF THE EMBODIMENTS

Figure 1:
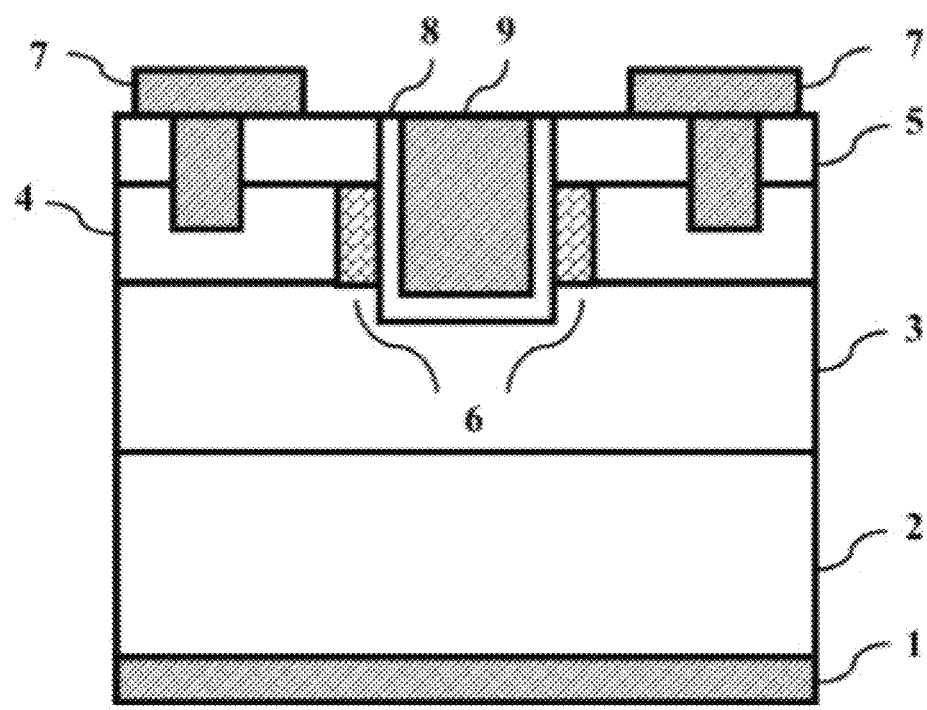
FIG. 1 is a schematic structural diagram of a vertical UMOSFET device with a high channel mobility provided by a typical embodiment of the present application.

In view of the deficiencies in the prior art, the applicant of this case was able to put forward the technical solution of the present application after long-term research and a lot of practice. The technical solution, implementation process and principle and the like will be further explained as follows.

In view of the problem that trench etching may deteriorate the electron mobility of a channel region inversion layer, a method for implementing a UMOSFET with a high channel mobility is proposed. A P⁺ channel layer close to the surface of a groove structure is converted into a high resistivity semiconductor, so that a region of the device where inversion actually occurs is transferred from the surface to the inside of the channel layer without etching damage, thereby avoiding deterioration of the mobility of the channel region inversion layer caused by trench etching, and obtaining a vertical UMOSFET device with a high channel mobility.

An embodiment of the present application provides a vertical UMOSFET device with a high channel mobility, which includes an epitaxial structure, and a source, a drain and a gate which match the epitaxial structure, where the epitaxial structure includes a first semiconductor, and a second semiconductor and a third semiconductor which are sequentially disposed on the first semiconductor, a groove structure matching the gate is also disposed in the epitaxial structure, and the groove structure continuously extends into the first semiconductor from a first surface of the epitaxial structure; a fourth semiconductor is also disposed at least between an inner wall of the groove structure and the second semiconductor, and the fourth semiconductor is a high resistivity semiconductor.

In some more specific embodiments, the first semiconductor may be a lightly doped N⁻ drift layer.

Further, the lightly doped N⁻ drift layer may be doped with C or Fe to reduce the background carrier concentration, and the doping concentration is less than or equal to 5e16 cm⁻³; and preferably, the thickness of the lightly doped N⁻ drift layer may be greater than or equal to 1 μm and less than or equal to 100 μm.

In some embodiments, the second semiconductor may be a highly doped P⁺ channel layer; preferably, the second semiconductor includes a P-type wide bandgap semiconductor; preferably, the P-type wide bandgap semiconductor includes a P-type III-nitride; and preferably, the P-type III-nitride includes p-GaN or p-InGaN, but is not limited thereto.

Furthermore, the highly doped P$^+$ channel layer adopts Mg doping to realize p-type, and the doping concentration is greater than or equal to 2e18 cm$^{-3}$.

Preferably, the thickness of the highly doped P$^+$ channel layer is greater than or equal to 200 nm and less than or equal to 100 μm.

Further, the epitaxial growth of the highly doped P$^+$ channel layer needs to be activated, which can be carried out in the UMOSFET preparation process in addition to in-situ activation in an epitaxial growth chamber. For example, the etching of the foregoing groove structure can be carried out first to form a window, and then the ex-situ activation can be completed outside the epitaxial growth chamber. The activation methods include high temperature annealing or low energy electron radiation activation, and the like.

In some embodiments, the third semiconductor is an N$^+$ source region layer, which may be a highly doped N$^+$ source region layer.

Further, the N$^+$ source region layer can achieve n-type by adopting Si or Ge doping, or can be converted into N$^+$ high doping by Si ion implantation into a local region of the highly doped P$^+$ channel layer, and the doping concentration is greater than or equal to 2E18 cm$^{-3}$. The N$^+$ source region layer is formed by Si ion implantation in a selected region of the P$^+$ channel layer, which can avoid the problems of quality degradation of continuous epitaxial growth crystal, p-GaN re-passivation and the like in the prior art.

In some embodiments, the vertical UMOSFET device with a high channel mobility may further include a substrate, and the first semiconductor and the drain are disposed on surfaces of two sides of the substrate facing away from each other respectively.

Further, the substrate may be a GaN substrate, especially a lightly doped GaN substrate, with a dislocation density less than 5×10$^6$ cm$^{-3}$ and a surface roughness less than 0.2 nm.

Preferably, the substrate can be integrated with the first semiconductor. If a thinned lightly doped GaN substrate is selected as the lightly doped N$^-$ drift layer, a substrate thinning process and a back drain electrode can be implemented after a front surface process is completed, and the drain electrode can form ohmic contact after the back etching treatment. More specifically, the drain electrode can deposit metal to form ohmic contact after back etching treatment.

In some embodiments, the angle between a side wall and a bottom wall of the groove structure needs to be maintained at 90 degree as far as possible, that is, the side wall of the groove structure is perpendicular to the bottom wall.

Further, the groove structure is used for setting the gate, also called a gate groove, which may be a U-shaped groove.

Further, the passivation layer includes Al$_2$O$_3$, SiO$_2$, silicon nitride (Si$_3$N$_4$), AlN or HfO$_2$, or a combination of the multiple materials, but is not limited thereto.

Further, the sources may be distributed on both sides of the gate.

Further, the width of the gate groove, the distance between the two sources, and the shape of device cells are all variable. For example, in shape, the cells may not be limited to rectangular cells, hexagonal cells, and the like.

Further, the source and the drain are connected to a low potential and a high potential of a power supply respectively.

Further, for a GaN-based UMOSFET device with a vertical structure, in order to reduce on-resistance, hexagonal cells can be used to increase a gate width in unit area of an active region in addition to a conventional strip-shaped cell array to obtain a larger cell density, thereby reducing on-resistance of the device and improving current density.

In some embodiments, the high resistivity semiconductor is formed by treating a local region of the second semiconductor by any one of ion implantation and passivation processes, thereby converting a P$^+$ channel layer close to the surface of the gate groove into a high resistivity layer, so that a region of the device where inversion actually occurs is transferred from the surface to the inside of the channel layer without etching damage, thereby avoiding deterioration of the mobility of a channel region inversion layer caused by trench etching, and obtaining a vertical UMOSFET device with a high channel mobility. Preferably, ion implanted elements include F, N, Ar, H, and O. Preferably, the passivation process includes plasma surface passivation or passivation at 300-800° C. Preferably, the passivation process is carried out in NH$_3$ or H$_2$ atmosphere.

In some embodiments, the fabrication of the high resistivity semiconductor may be performed before or after fabrication of a gate groove.

In some more specific embodiments, when no voltage is applied to the gate or the applied voltage is lower than zero voltage, the UMOSFET device is in an off state; and when the voltage applied to the gate is greater than zero voltage and higher than a threshold voltage, the UMOSFET device is in an on state.

In some more specific embodiments, when zero bias voltage is applied to the gate or no bias voltage is applied, an inversion layer is not formed on a side of the high resistivity semiconductor (namely the high resistivity layer), while when the gate voltage is greater than the threshold voltage, an inversion layer channel can be formed on a side of the high resistivity semiconductor and the surface of the P$^+$ channel layer.

The working principle of the vertical UMOSFET device with a high channel mobility provided by the present application is at least that the structure of the UMOSFET device includes a parasitic bipolar junction transistor structure consisting of an N$^+$ source region layer, a P$^+$ channel layer and an N$^-$ drift layer, and the P$^+$ channel layer actually corresponds to the channel length of the device, so that the width of a P-type channel layer in the UMOSFET device is very narrow to obtain a shorter channel length and a smaller on-resistance, thereby causing a parasitic NPN transistor to have a large inherent current gain, so that the open circuit breakdown voltage of a base is far smaller than the breakdown voltage of a collector. The UMOSFET short-circuits an emitter (N$^+$ source region layer) and the base (P$^+$ channel layer) of the NPN transistor to prevent the current gain and breakdown voltage from falling.

Further, the source and the drain of the vertical structure UMOSFET device are connected to the low potential and the high potential of the power supply respectively, and a PN junction composed of the P$^+$ channel layer and an N-type drift region (namely the N$^-$ drift layer) is in a reverse bias state. When the thickness of the P$^+$ channel layer gradually decreases, a depletion region of the PN junction may extend into the entire channel layer before the collision ionization breakdown of the device occurs, thereby causing punch-through breakdown. Therefore, it is necessary to ensure that the P$^+$ channel layer (or called the P-type channel layer) has a sufficiently high doping concentration and a certain thickness to prevent the occurrence of punch-through breakdown.

Specifically, when the device is in an on state, inversion layer channels are formed on the surfaces of the high resistivity semiconductor and the P$^+$ channel layer. When a positive bias voltage is applied to the drain, the inversion layer channel provides a transmission channel for electrons from a source region to a drain region. After the electrons pass through the inversion layer channel from the source, the electrons are transmitted to the N⁻ drift layer at the bottom of the U-shaped gate groove, and the current spreads out in the cross-sectional range of the whole device cell and finally reaches the drain. When the applied gate voltage is less than zero or lower than the threshold voltage, inversion does not occur in the P⁺ channel layer. A reverse bias PN junction is formed between the P⁺ channel layer and the N⁻ drift layer to hinder electron transmission, and the device is in an off state at this time.

More specifically, the present application specifically relates to a vertical structure UMOSFET device, which can be applied as a power MOS field effect transistor with low on-resistance, high frequency and high breakdown voltage.

In the following, the technical solution of the present application will be further explained with reference to the accompanying drawings and specific embodiments and the like.

Referring to FIG. 1, a vertical MOSFET device with a high channel mobility may be a GaN-based UMOSFET device with a vertical structure, which may include a substrate 2, and an N⁻ drift layer 3, a P⁺ channel layer 4, and an N⁺ source region layer 5 which are sequentially formed on the front surface of the substrate 2, and further includes a U-shaped gate groove, sources 7, a drain 1, and a gate 9, where the sources 7 are electrically connected to the P⁺ channel layer 4 and the N⁺ source region layer 5 simultaneously, the drain 1 is disposed on the back surface of the substrate 2, and the sources 7 are disposed on both sides of the gate 9; the U-shaped gate groove passes through the N⁺ source region layer 5 and the P⁺ channel layer 4 from an upper surface of the N⁺ source region layer 5, a top end of the U-shaped gate groove is disposed on an upper surface of the N⁺ source region layer 5, a bottom end is disposed in the N⁻ drift layer 3, the gate 9 is disposed in the U-shaped gate groove, a passivation layer 8 is disposed between the gate 9 and an inner wall of the U-shaped gate groove, high resistivity semiconductors 6 are also disposed between the U-shaped gate groove and the P⁺ channel layer 4, the high resistivity semiconductors 6 are disposed on both sides of the U-shaped gate groove, and the high resistivity semiconductor 6 and the P⁺ channel layer 4 are integrated; specifically, the high resistivity semiconductors 6 are each formed by ion implantation or passivation of a portion of the P⁺ channel layer 4 close to the U-shaped gate groove.

In a more specific embodiment of the present application, a method for manufacturing a vertical structure UMOSFET device may include the following steps.

1): Sequentially homoepitaxially epitaxially grow a lightly doped N⁻ drift layer 3 on a substrate 2 through metal organic chemical vapor deposition first to obtain a drift region with good crystal quality and a lightly doped concentration on the premise of ensuring high lattice adaptation and small thermal mismatch, and then sequentially epitaxially grow a highly doped P⁺ channel layer 4 and a highly doped N⁺ source region layer 5 upwards.

2): After the epitaxial process is completed, form a groove structure with uniform etching depth, smooth side wall and bottom, steep side wall and little damage in a local region on the surface of the obtained device through an etching process by optimizing etching process conditions as a window for depositing a passivation layer and gate metals. At the same time, in order to prevent the reduction of a breakdown voltage caused by a larger inherent current gain of a parasitic NPN transistor in the UMOSFET device, it is necessary to ensure that the channel layer is short-circuited with the source region layer, which requires etching to be carried out in a region where a source is disposed to expose the P⁺ channel layer 4 as a window for depositing source metals.

3): Form a high resistivity semiconductor in a local region of a second semiconductor, specifically, convert a surface region of a side wall of a gate groove in contact with the second semiconductor to the high resistivity semiconductor, where the conversion method may be ion implantation, so that the second semiconductor in the ion implantation region no longer has P-type characteristics, and thus an inversion layer forming region of the device can be moved to one side of the high resistivity layer.

4): After the MOCVD material growth and the local process of the device, set a source electrode 7 and a drain electrode 1 on the front surface and the back surface of the obtained device respectively, and deposit a passivation layer 8 and gate metals in the gate groove, where when zero bias voltage is applied to a gate electrode 9, an MIS structure consisting of the P⁺ channel layer 4, the passivation layer 8 and the gate electrode 9 is in a flat band state, and the N⁻ drift layer 3 and the P⁺ channel layer 4 are in a reverse bias state, so the drain electrode 1 and the source electrode 7 of the device are disconnected, and the device is in an off state; when the applied gate voltage is less than zero, a valence band of the P⁺ channel layer 4 along the side wall of the groove bends upward, and a majority of carriers (holes) are in an accumulated state on the surface; when the applied gate voltage is greater than zero and less than a threshold voltage, an energy band bends downward, and the majority of carriers are exhausted; when the gate voltage greater than the threshold voltage is applied, the energy band bends further downward, and a minority of carriers (electrons) emitted from the surface exceed the holes and are in an inversion state; at this time, the connection between the drain electrode 1 and the source electrode 7 can be realized through this inversion channel, and the device is connected.

Embodiment 1

Figure 2:
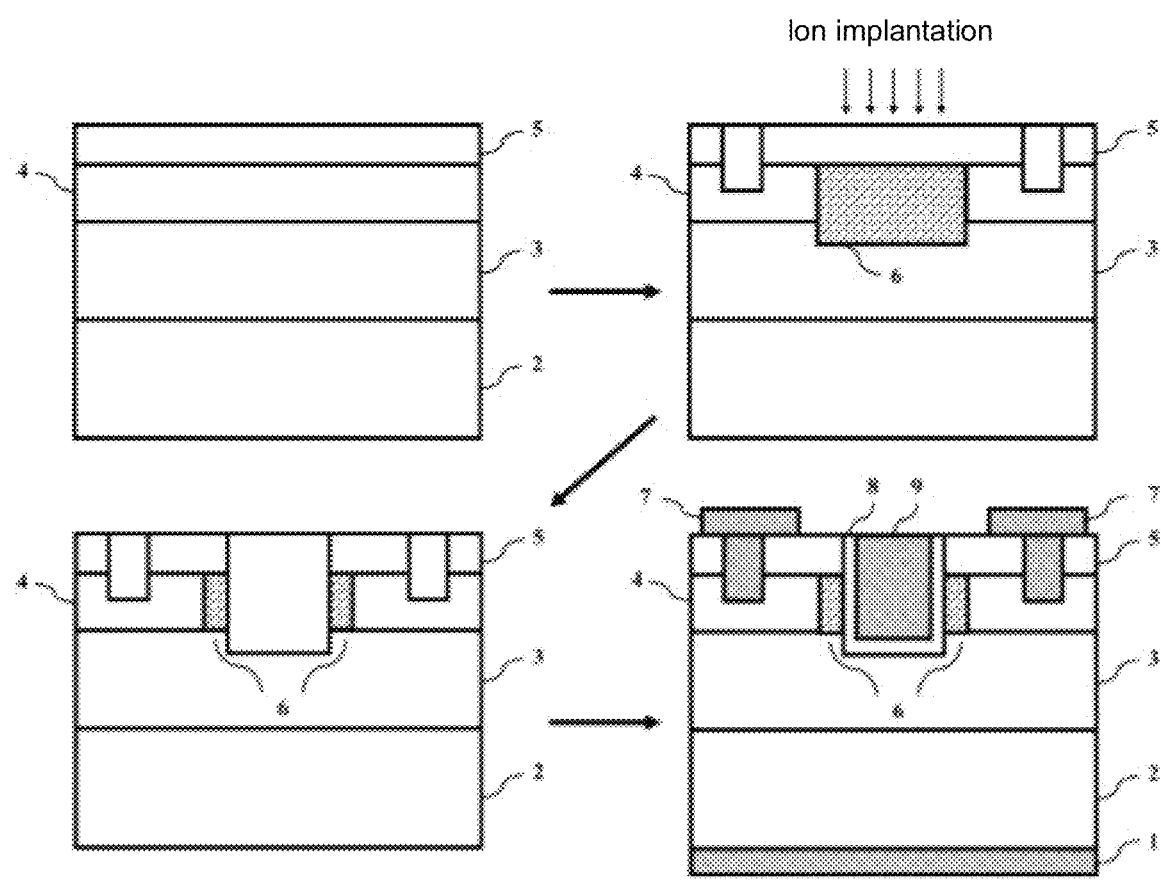
FIG. 2 is a flow chart of a process for preparing a vertical UMOSFET device with a high channel mobility provided by Embodiment 1 of the present application.

Referring to FIG. 2, a method for manufacturing a vertical structure UMOSFET device may include the following steps.

(1): Pretreat the surface of a substrate in an MOCVD reaction chamber.

(2): Homoepitaxially grow a lightly doped N⁻ drift layer 3, a highly doped P⁺ channel layer 4 and a highly doped N⁺ source region layer 5 on the surface of the substrate in sequence, where the drift layer has a thickness of more than 2 μm, the channel layer has a thickness of 0.4-1.2 μm, and a doping concentration is on the order of $10^{18}$-$10^{19}$ cm$^{-3}$; take out the epitaxial wafer from the MOCVD reaction chamber, clean the epitaxial wafer with an organic solution, and purge the epitaxial wafer with high-purity nitrogen.

(3): Perform photolithographic development on the cleaned epitaxial wafer, where a photoresist is AZ5214, the exposure time is 6.5 s, and the development time is 50-60 s to form an ion implantation window; and cause a portion of the P⁺ channel layer 4 corresponding to the ion implantation window to lose P-type characteristics by using an ion implantation machine or an inductively coupled plasma etching machine to form a high resistivity semiconductor 6, and then perform annealing and repairing in an N₂ environment.

(4): Perform in-situ groove structure etching on the cleaned sample to form a U-shaped gate groove, where etching can be performed by adopting plasma etching and wet etching methods.

(5): Clean the sample after etching the U-shaped gate groove with an organic solution first and purge the sample with high-purity nitrogen, and then deposit a gate electrode passivation layer 8, where the passivation layer 8 includes $Al_2O_3$, $Si_3N_4$, AlN or $HfO_2$, or a combination of the multiple materials, and can be implemented by adopting low-pressure chemical vapor deposition, plasma enhanced chemical vapor deposition or plasma enhanced atomic layer deposition processes, and the like.

(6): Perform photolithographic development on the sample after the passivation layer 8 is grown, and perform mesa isolation, which can be performed by adopting ion implantation or plasma etching.

(7): Etch a region of a source electrode 7 through photoetching, where the etching depth needs to reach the $P^+$ channel layer 4, and then deposit source electrode and drain electrode metals Ti/Al/Ni/Au (Ti/Al/Ni/Au is a Ti layer, an Al layer, an Ni layer and an Au layer which are laminated and have thicknesses of 20 nm, 130 nm, 50 nm, and 50 nm respectively) on the front surface and the back surface of the sample respectively by using an electron beam evaporation process, and carry out stripping and cleaning to form the source electrode 7 and a drain electrode 1.

(8): Form a gate region through photoetching, where the gate is Ni/Au (namely an Ni layer and an Au layer which are laminated, with thicknesses of 50 nm and 250 nm respectively), which can be implemented by electron beam evaporation and magnetron sputtering; then perform stripping and cleaning, and perform annealing at 400° C. for 10 min under nitrogen atmosphere to complete the fabrication of the whole device.

Embodiment 2

Figure 3:
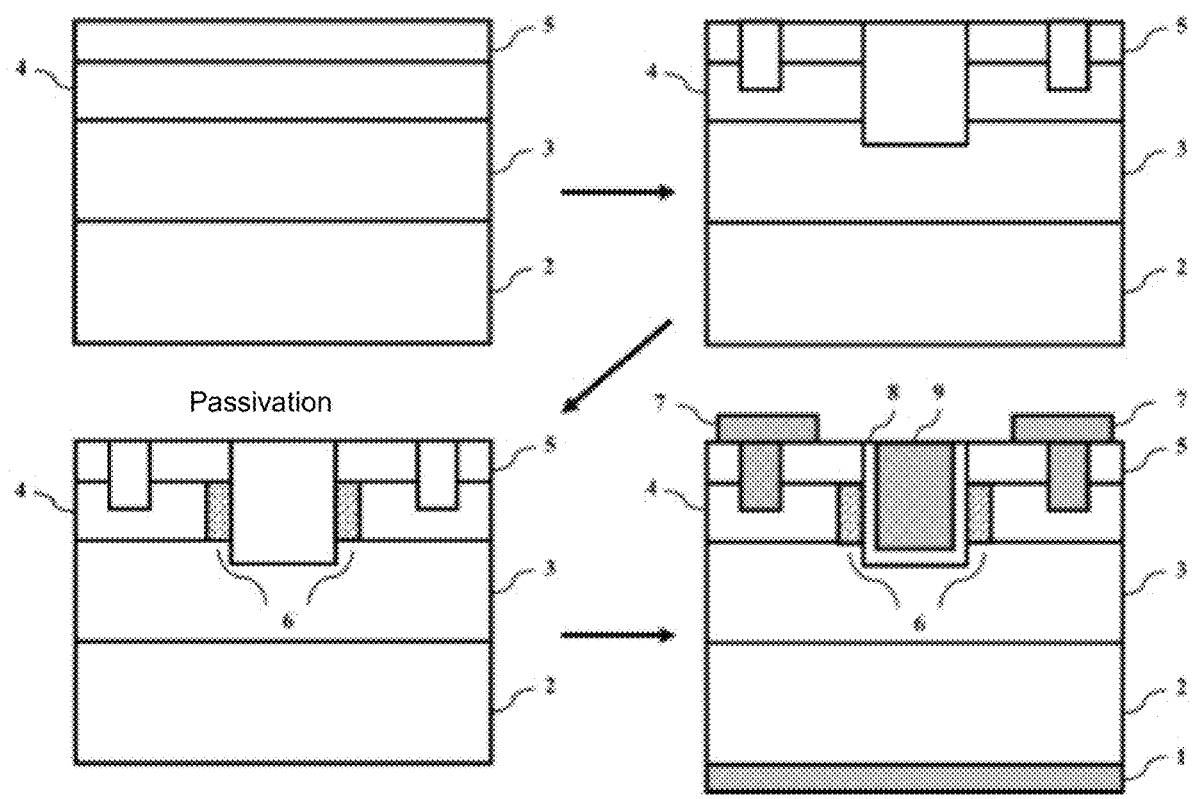
FIG. 3 is a flow chart of a process for preparing a vertical UMOSFET device with a high channel mobility provided by Embodiment 2 of the present application.

Referring to FIG. 3, a method for manufacturing a vertical structure UMOSFET device may include the following steps.

(1): Pretreat the surface of a substrate in an MOCVD reaction chamber.

(2): Homoepitaxially grow a lightly doped $N^-$ drift layer 3, a highly doped $P^+$ channel layer 4 and a highly doped $N^+$ source region layer 5 on the surface of the substrate in sequence, where the drift layer has a thickness of more than 2 μm, the channel layer has a thickness of 0.4-1.2 μm, and a doping concentration is on the order of $10^{18}$-$10^{19}$ $cm^{-3}$; take out the epitaxial wafer from the MOCVD reaction chamber, clean the epitaxial wafer with an organic solution, and purge the epitaxial wafer with high-purity nitrogen.

(3): Perform photolithographic development on the cleaned sample, where a photoresist is AZ5214, the exposure time is 6.5 s, and the development time is 50-60 s; etch a groove structure to form a U-shaped gate groove, where the etching may be performed by using plasma etching and wet etching methods; in addition to the photoresist, hard masks such as $SiO_2$ can also be used; an $SiO_2$ layer can be grown by inductively coupled plasma chemical vapor deposition or plasma enhanced chemical vapor deposition or the like; the $SiO_2$ mask can be etched by adopting the photoresist as a mask, and an $SiO_2$ etching method may be reactive ion etching or the like.

(4): Perform plasma surface treatment or high-temperature passivation treatment on the sample after the etching of the U-shaped gate groove is completed, and specifically, perform the plasma surface passivation under the atmosphere of $H_2$ or $NH_3$ and the like or passivation at 300-800° C. to convert a portion of the $P^+$ channel layer 4 close to the side wall of the gate groove to form a high resistivity semiconductor 6.

(5): Clean the sample with an organic solution first and purge the sample with high-purity nitrogen, and then deposit a gate electrode passivation layer 8, which includes $Al_2O_3$, $Si_3N_4$, AlN or $HfO_2$ or a combination of the multiple materials, and can be implemented by adopting low-pressure chemical vapor deposition, plasma enhanced chemical vapor deposition or plasma enhanced atomic layer deposition processes, and the like.

(6): Perform photolithographic development on the sample after the passivation layer is grown, and perform mesa isolation, which can be performed by adopting ion implantation or plasma etching.

(7): Etch a region of a source electrode 7 through photoetching, where the etching depth needs to reach the $P^+$ channel layer 4, and then deposit source electrode and drain electrode metals Ti/Al/Ni/Au (Ti/Al/Ni/Au is a Ti layer, an Al layer, an Ni layer and an Au layer which are laminated and have thicknesses of 20 nm, 130 nm, 50 nm, and 50 nm respectively) on the front surface and the back surface of the sample respectively by using an electron beam evaporation process, and carry out stripping and cleaning to form the source electrode 7 and a drain electrode 1.

(8): Form a gate region through photoetching, where the gate is Ni/Au (namely an Ni layer and an Au layer which are laminated, with thicknesses of 50 nm and 250 nm respectively), which can be implemented by electron beam evaporation and magnetron sputtering; then perform stripping and cleaning, and perform annealing at 400° C. for 10 min under nitrogen atmosphere to form Schottky contact to complete the fabrication of the whole device.

It should be noted that an N-type drift layer or the N-type drift region is the $N^-$ drift layer, an N-type source region layer or an N-type source region is the $N^+$ source region layer, and the P-type channel layer is the $P^+$ channel layer. The high resistivity semiconductor can also be referred to as a high resistivity layer or a high resistivity semiconductor layer. The gate electrode is the gate, the source electrode is the source, and the drain electrode is the drain. The groove matching the source can be understood as a gate groove or a groove structure, and a gate groove region refers to a region formed by the gate groove. The materials of the $N^-$drift layer and the $N^+$ source region layer may be materials known to those skilled in the Art.

According to the vertical UMOSFET device with a high channel mobility and the preparation method thereof provided by the present application, a $P^+$ channel layer close to the surface of a gate groove is converted into a high resistivity semiconductor, so that a region of the device where inversion actually occurs is transferred from the surface to the inside of the channel layer without etching damage, thereby avoiding deterioration of the mobility of an inversion layer of a channel region caused by trench etching, and obtaining a vertical UMOSFET device with a high channel mobility. The $P^+$ channel layer and the high resistivity semiconductor can be converted to each other by a process mode, and the process mode is ion implantation or passivation treatment or the like. This method does not involve secondary epitaxy, has simple process, and avoids interface pollution and parasitic channel problems. Moreover, the process requirements are relatively low, a process window is relatively large, and the damage to the device is small. The UMOSFET devices of multiple solutions can be implemented. The device has high repeatability and low cost, and mass production is easy.

It should be understood that the foregoing embodiments are merely illustrative of the technical concept and features of the present application, the purpose is to enable those skilled in the art to understand the content of the present application and to implement the present invention, and this does not limit the protection scope of the present application. Equivalent variations or modifications made in accordance with the spirit of the present application should fall within the protection scope of the present application.

What is claimed is:

1. A method for manufacturing a vertical UMOSFET device with a high channel mobility, comprising the steps of:
manufacturing an epitaxial structure comprising a substrate;
manufacturing a source, a drain and a gate which match the epitaxial structure, wherein the epitaxial structure comprises a first semiconductor, and a second semiconductor and a third semiconductor which are sequentially disposed on the first semiconductor; wherein the first semiconductor is grown on the substrate, wherein the second semiconductor is grown on the first semiconductor, and wherein the third semiconductor is grown on the second semiconductor, wherein a groove structure matching the gate is also disposed in the epitaxial structure, and the groove structure continuously extends into the first semiconductor from a first surface of the epitaxial structure; wherein the first surface of the epitaxial structure is a surface of the third semiconductor facing away from the second semiconductor wherein the manufacturing method also comprises the step of manufacturing a fourth semiconductor in the epitaxial structure; the fourth semiconductor is disposed at least between an inner wall of the groove structure and the second semiconductor, and the fourth semiconductor comprises any one of GaN and InGaN, wherein the step of manufacturing the groove structure is performed after the step of forming the fourth semiconductor,
by processing at least a region of the second semiconductor corresponding to the groove structure and the fourth semiconductor first to convert a composition material of the second semiconductor in the region into a material of the fourth semiconductor, and then processing the groove structure in the epitaxial structure.

2. The manufacturing method according to claim 1, comprising: converting a composition material of the second semiconductor into a material of the fourth semiconductor by using at least an ion implantation treatment method, wherein implanted elements used in the ion implantation method comprise any one of F, N, Ar, H and O.

3. The manufacturing method according to claim 1, wherein at least one of:
the fourth semiconductor is formed by converting a portion of the second semiconductor adjacent to the inner wall of the groove structure, and the fourth semiconductor surrounds the gate; and
the inner wall of the groove structure is smooth, and a side wall and a bottom wall form an angle of 90 degrees.

4. The manufacturing method according to claim 1, further comprising: covering at least the inner wall of the groove structure with a continuous passivation layer, and then manufacturing a gate; wherein, the passivation layer comprises any one or a combination of two or more of $Al_2O_3$, $SiO_2$, $Si_3N_4$, AlN, and $HfO_2$.

5. The manufacturing method according to claim 1, wherein at least one of:
the first semiconductor comprises an $N^-$ drift layer; and
the first semiconductor has a thickness of 1-100 μm; and
the third semiconductor comprises an $N^+$ source region layer; and
the second semiconductor comprises a $P^+$ channel layer; wherein the second semiconductor comprises a P-type wide bandgap semiconductor; wherein the P-type wide bandgap semiconductor comprises a P-type III-nitride; wherein the P-type III-nitride comprises any one of p-GaN and p-InGaN; and
the second semiconductor has a thickness of 200 nm to 100 μm; and
the third semiconductor is formed by converting at least a local region of a surface layer of the second semiconductor.

6. The manufacturing method according to claim 1, wherein at least one of:
the source and the gate are disposed on the first surface of the epitaxial structure, the drain is connected to a second surface of the epitaxial structure, and the first surface and the second surface are faced away from each other; and
the epitaxial structure also comprises a groove matching the source, and the groove matching the source extends into the second semiconductor from the surface of the epitaxial structure such that the source is simultaneously electrically connected to at least the second semiconductor and the third semiconductor; and
the UMOSFET device comprises two or more sources; wherein the two or more sources are distributed on at least two sides of the gate; and
the UMOSFET device also comprises a substrate, and the drain is disposed on a surface of the other side of the substrate faced away from the surface of the side of the substrate; wherein the substrate comprises GaN; wherein the substrate is a lightly doped GaN substrate with a dislocation density less than $5\times10^6$ cm$^{-3}$ and a surface roughness less than 0.2 nm; and
the substrate and the first semiconductor are integrated; and
the drain forms an ohmic contact with the surface of the other side of the substrate.

7. A method for manufacturing a vertical UMOSFET device with a high channel mobility, comprising the steps of:
manufacturing an epitaxial structure comprising a substrate;
manufacturing a source, a drain and a gate which match the epitaxial structure, wherein the epitaxial structure comprises a first semiconductor, and a second semiconductor and a third semiconductor which are sequentially disposed on the first semiconductor; wherein the first semiconductor is grown on the substrate, wherein the second semiconductor is grown on the first semiconductor, and wherein the third semiconductor is grown on the second semiconductor, wherein a groove structure matching the gate is also disposed in the epitaxial structure, and the groove structure continuously extends into the first semiconductor from a first surface of the epitaxial structure; wherein the first surface of the epitaxial structure is a surface of the third semiconductor facing away from the second semiconductor wherein the manufacturing method also comprises the step of manufacturing a fourth semiconductor in the epitaxial structure; the fourth semiconductor is disposed at least between an inner wall of the groove structure and the second semiconductor, and the fourth semiconductor comprises any one of GaN and InGaN, wherein the step of manufacturing the groove structure is performed before the step of forming the fourth semiconductor by processing the groove structure in the epitaxial structure first, and then processing a region of the second semiconductor corresponding to the fourth semiconductor to convert a composition material of the second semiconductor in the region into a material of the fourth semiconductor.

8. The manufacturing method according to claim 7, comprising: converting a composition material of the second semiconductor into a material of the fourth semiconductor by using a passivation treatment method; wherein the passivation treatment method comprises a plasma surface passivation treatment method; wherein the passivation treatment method is implemented at a temperature of 300-800° C. and in $NH_3$ or $H_2$ atmosphere.

9. The manufacturing method according to claim 7, wherein at least one of:
the fourth semiconductor is formed by converting a portion of the second semiconductor adjacent to the inner wall of the groove structure, and the fourth semiconductor surrounds the gate; and
the inner wall of the groove structure is smooth, and a side wall and a bottom wall form an angle of 90 degrees.

10. The manufacturing method according to claim 7, further comprising: covering at least the inner wall of the groove structure with a continuous passivation layer, and then manufacturing a gate; wherein preferably, the passivation layer comprises any one or a combination of two or more of $Al_2O_3$, $SiO_2$, $Si_3N_4$, AlN, and $HfO_2$.

11. The manufacturing method according to claim 7, wherein at least one of:
the first semiconductor comprises an $N^-$ drift layer; and
the first semiconductor has a thickness of 1-100 μm; and
the third semiconductor comprises an $N^+$ source region layer; and
the second semiconductor comprises a $P^+$ channel layer; wherein the second semiconductor comprises a P-type wide bandgap semiconductor; wherein the P-type wide bandgap semiconductor comprises a P-type III-nitride; wherein the P-type III-nitride comprises any one of p-GaN and p-InGaN; and
the second semiconductor has a thickness of 200 nm to 100 μm; and
the third semiconductor is formed by converting at least a local region of a surface layer of the second semiconductor.

12. The manufacturing method according to claim 7, wherein at least one of:
the source and the gate are disposed on the first surface of the epitaxial structure, the drain is connected to a second surface of the epitaxial structure, and the first surface and the second surface are faced away from each other; and
the epitaxial structure also comprises a groove matching the source, and the groove matching the source extends into the second semiconductor from the surface of the epitaxial structure such that the source is simultaneously electrically connected to at least the second semiconductor and the third semiconductor; and
the UMOSFET device comprises two or more sources; wherein the two or more sources are distributed on at least two sides of the gate; and
the UMOSFET device also comprises a substrate, and the drain is disposed on a surface of the other side of the substrate faced away from the surface of the side of the substrate; wherein the substrate comprises GaN; wherein the substrate is a lightly doped GaN substrate with a dislocation density less than $5 \times 10^6$ cm$^{-3}$ and a surface roughness less than 0.2 nm; and
the substrate and the first semiconductor are integrated; and
the drain forms an ohmic contact with the surface of the other side of the substrate.

\* \* \* \* \*